United States Patent
Abe et al.

(10) Patent No.: US 6,374,834 B1
(45) Date of Patent: Apr. 23, 2002

(54) SUBSTRATE PROCESSING METHOD AND PROCESSING APPARATUS

(75) Inventors: Tatsuo Abe, Shirakawa; Tsutomu Doi, Yokohama, both of (JP)

(73) Assignees: Shin-Etsu Handotai Co., Ltd., Tokyo; Shibaura Mechatronics Corporation of Kanagawa, both of (JP)

( * ) Notice: Subject to any disclaimer, the term of this patent is extended or adjusted under 35 U.S.C. 154(b) by 74 days.

(21) Appl. No.: 09/629,301

(22) Filed: Jul. 31, 2000

Related U.S. Application Data

(63) Continuation of application No. PCT/JP99/06663, filed on Nov. 29, 1999.

(30) Foreign Application Priority Data

Dec. 7, 1998 (JP) ............................................ 10-346985

(51) Int. Cl.⁷ .............................. B08B 3/12; B08B 7/04
(52) U.S. Cl. .............................. 134/1.3; 134/1; 134/18; 134/32; 134/33; 134/34; 134/58 R; 134/113; 134/902
(58) Field of Search ............................. 134/1, 1.3, 2, 3, 134/18, 32, 33, 34, 58 R, 113, 184, 186, 902

(56) References Cited

U.S. PATENT DOCUMENTS

| 5,938,508 A | * | 8/1999 | Canella et al. ................. 451/54 |
| 5,965,042 A | * | 10/1999 | Saitoh .................... 219/121.68 |
| 6,121,067 A | * | 9/2000 | Canella ...................... 438/106 |
| 6,273,099 B1 | * | 8/2001 | Chang et al. ................ 134/1.3 |

FOREIGN PATENT DOCUMENTS

| JP | 01-310780 | * 12/1989 |
| JP | 590237 | 4/1993 |
| JP | 745575 | 2/1995 |
| JP | 9213666 | 8/1997 |
| TW | 86118214 | 10/1998 |

OTHER PUBLICATIONS 2 page Office Action and 1 page cover letter from Taiwanese Patent Office mailed Dec. 29, 2000.

* cited by examiner

*Primary Examiner*—Alexander Markoff
(74) *Attorney, Agent, or Firm*—Volpe and Koenig, P.C.

(57) ABSTRACT

This invention provides a cleaning method of cleaning a laser mark formed on a semiconductor wafer. A semiconductor wafer is rotated in a circumferential direction, and a laser mark is detected indirectly or directly in a non-contact manner. Rotation of the semiconductor wafer is controlled on the basis of detection of the laser mark, and an ultrasonic vibration-applied processing solution is sprayed to the laser mark.

13 Claims, 9 Drawing Sheets

SUBSTRATE PROCESSING METHOD AND PROCESSING APPARATUS

CROSS-REFERENCE TO RELATED APPLICATIONS

This is a Continuation of Application PCT/JP99/06663, filed Nov. 29, 1999.

This application is based upon and claims the benefit of priority from the prior Japanese Patent Application No. 10-346985, filed Dec. 7, 1998, the entire contents of which are incorporated herein by reference.

BACKGROUND OF THE INVENTION

The present invention relates to a substrate processing method and processing apparatus for cleaning a laser mark formed on a substrate such as a semiconductor wafer.

For example, a semiconductor device manufacturing process has a step where a semiconductor wafer must be cleaned at a high cleaning degree. Methods of cleaning a semiconductor wafer include the dip method of dipping a plurality of semiconductor wafers in a cleaning solution at once and the single wafer processing method of cleaning semiconductor wafers one by one by spraying a cleaning solution toward each semiconductor wafer. Recently, the single wafer processing method is often employed as it provides a high cleaning degree and it is advantageous in terms of cost when the semiconductor wafers are to be processed in a small lot.

As an example of the single wafer processing method, a cleaning apparatus which cleans the semiconductor wafer by using a cleaning tool such as a roll brush or disk brush is known. In this case, not only the roll brush or disk brush is rotated, but also the semiconductor wafer is rotated, so the brush comes into contact with the semiconductor wafer uniformly, thereby increasing the cleaning effect.

A semiconductor wafer has a laser mark, such as ID mark or lot No., in which information specific to the semiconductor wafer is marked with a laser beam. When a laser mark is marked on the semiconductor wafer with a laser beam, it forms a recess with a depth of about 20 $\mu$m to 50 $\mu$m.

Hence, a foreign substance is sometimes deposited in the recess of the laser mark. Particularly, since CMP (Chemical and Mechanical Polishing) is performed recently to cope with an increase in the number of wiring layers, a polishing agent used for this is inevitably deposited in the laser mark.

Conventionally, contamination deposited in the recess of the laser mark is not particularly cleaned out. If the surface of the semiconductor wafer is cleaned merely with the roll brush or disk brush, although the surface of the semiconductor wafer can be cleaned, contamination resulted from the polishing agent deposited in the recess of the laser mark cannot be cleaned out and removed. This contamination can cause a rejected article.

BRIEF SUMMARY OF THE INVENTION

The present invention provides a substrate processing method and processing apparatus capable of cleaning out and removing contamination deposited in a laser mark formed on a substrate.

According to an aspect of the present invention, there is provided, in a substrate processing method of cleaning a laser mark formed on a surface of a substrate, characterized by comprising the steps of holding the substrate and rotating the substrate in a circumferential direction, detecting a laser mark formed on the substrate in a non-contact manner, and controlling rotation of the substrate on the basis of detection of the laser mark and spraying an ultrasonic vibration-applied processing solution to the laser mark formed on the substrate.

According to another aspect of the present invention, there is provided a substrate processing apparatus for cleaning a laser mark formed on a surface of a substrate, characterized by comprising holding/driving means for holding the substrate and rotating the substrate in a circumferential direction, detection means for detecting a laser mark formed on the substrate in a non-contact manner indirectly or directly, an ultrasonic nozzle arranged to face a surface of the substrate to spray an ultrasonic vibration-applied processing solution toward the substrate, and control means for controlling rotation of the substrate held by the holding means on the basis of detection of the laser mark by the detection means, and cleaning the laser mark on the substrate with the processing solution sprayed from the ultrasonic nozzle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described with reference to the accompanying drawings.

Figure 1:
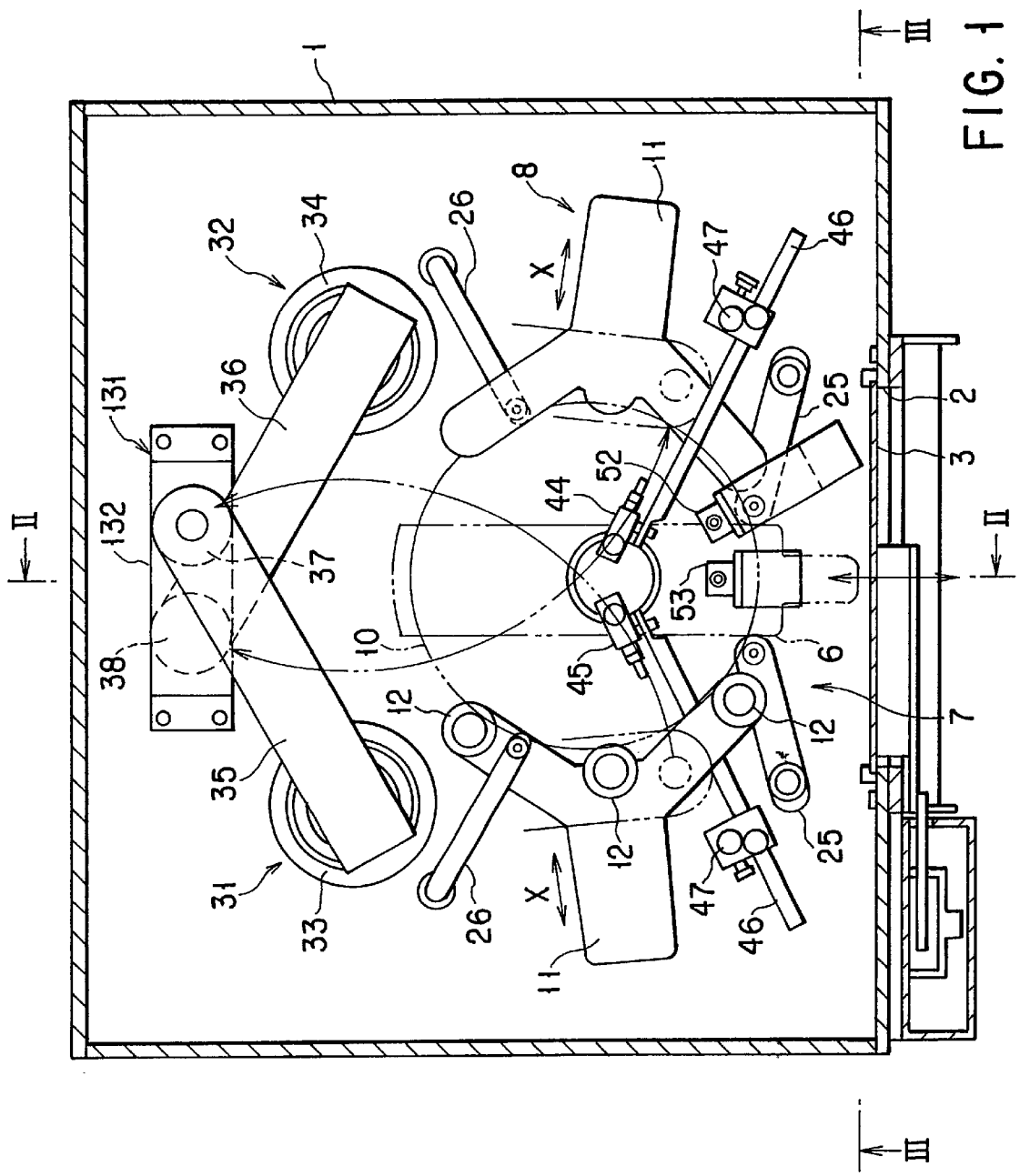
FIG. 1 is a cross-sectional view of a processing apparatus according to an embodiment of the present invention.
Figure 2:
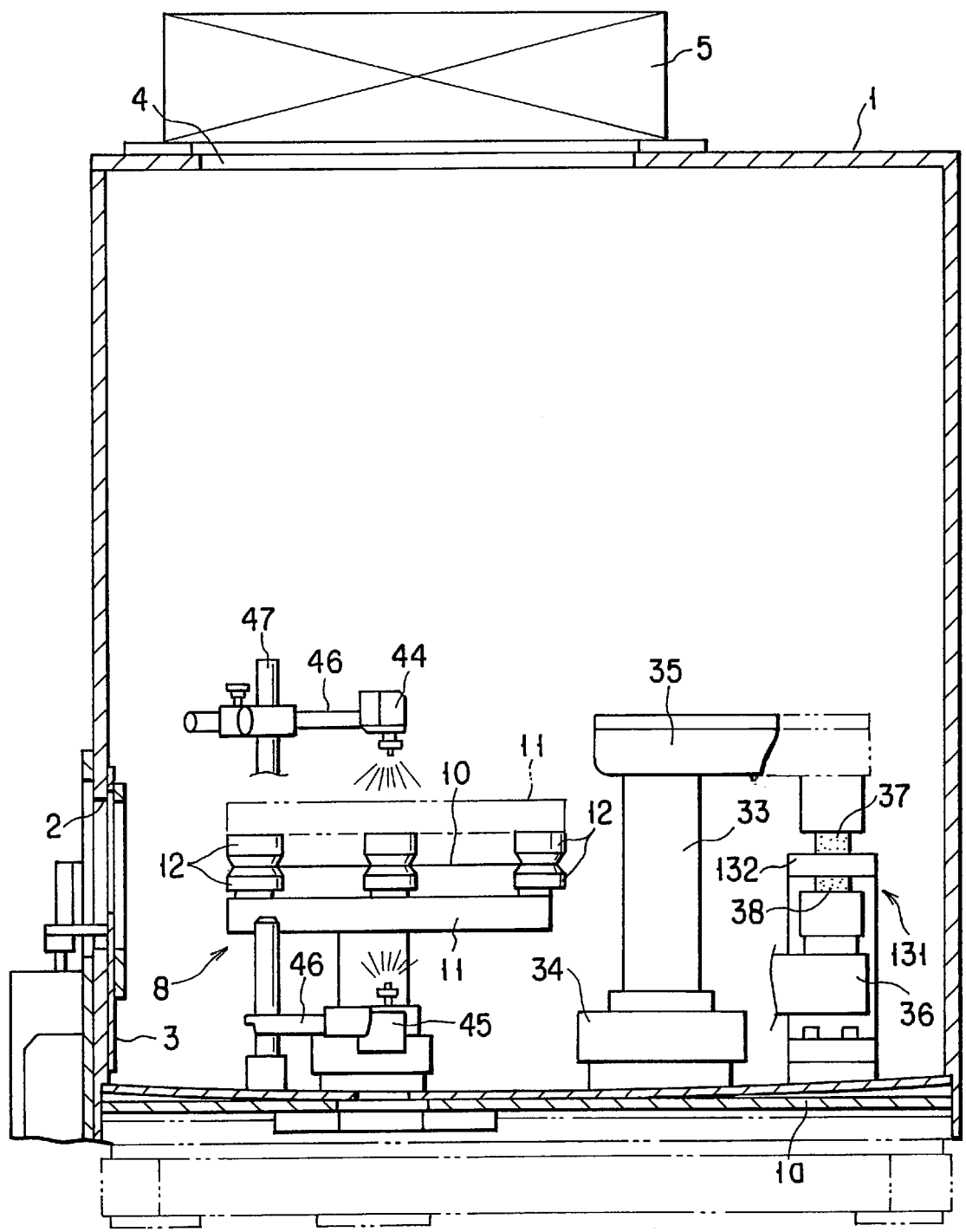
FIG. 2 is a sectional view taken along the line II—II of FIG. 1.
Figure 3:
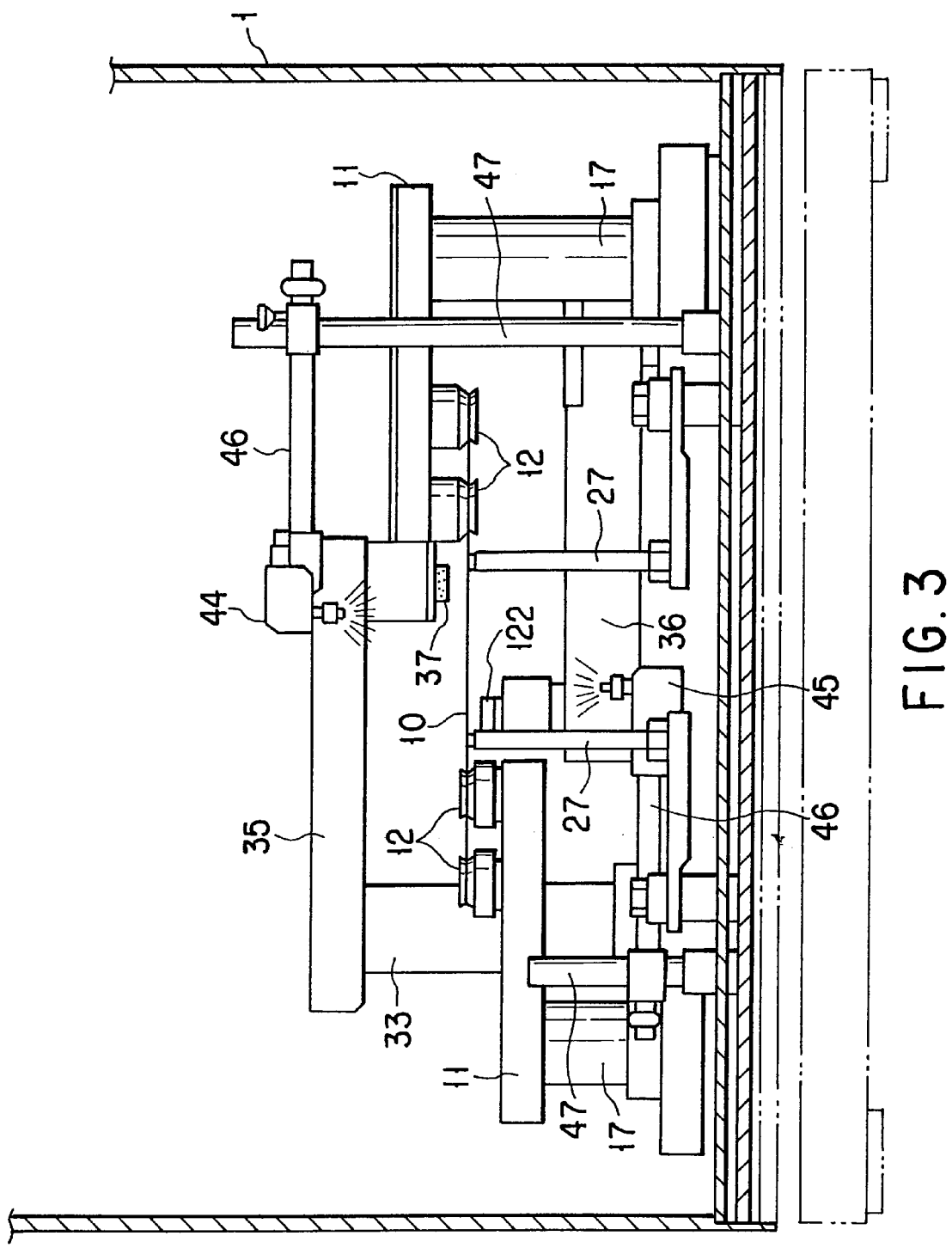
FIG. 3 is a sectional view taken along the line III—III of FIG. 1.
Figure 4:
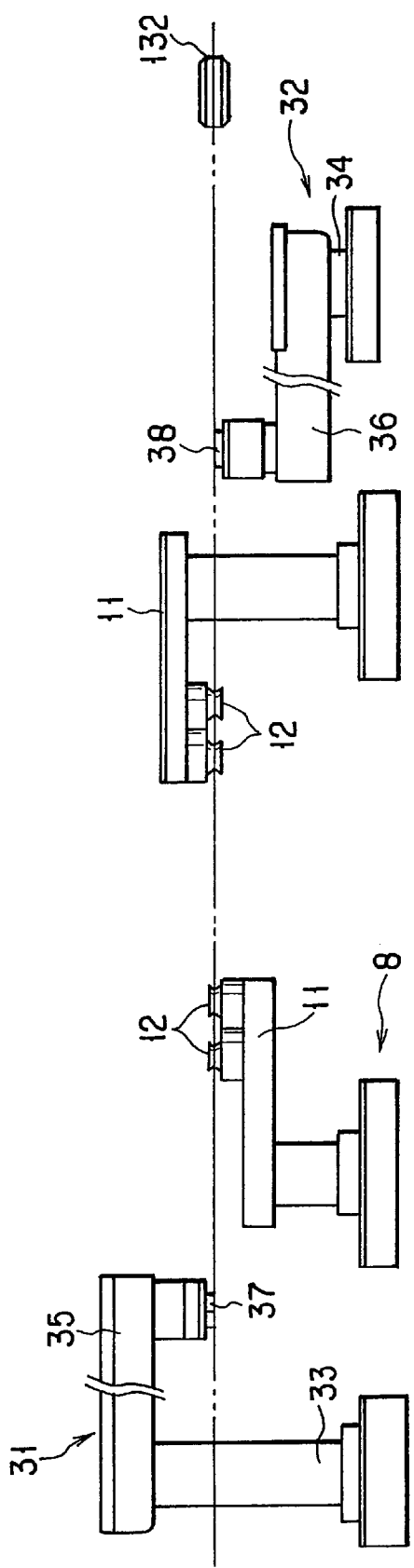
FIG. 4 is a view for explaining the positional relationship in height among a holding/driving means, a tool unit, and a brush cleaning unit according to this embodiment of the present invention.

A processing apparatus shown in FIGS. 1 to 3 according to the present invention has a process tank 1. An inlet/outlet port 2 is formed in the front surface of the process tank 1. The inlet/outlet port 2 is opened/closed by a shutter 3. A ventilation hole 4 is formed in the upper surface of the process tank 1, and a cleaning unit 5 is provided to the ventilation hole 4. Accordingly, clean air is introduced into the process tank 1 through the cleaning unit 5.

A support mechanism 7 for supporting a semiconductor wafer 10, as a substrate, loaded in the process tank 1 through the inlet/outlet port 2 by a robot hand 6 indicated by a chain line in FIG. 1, and a holding/driving means 8 for holding the semiconductor wafer 10 supported by the support mechanism 7 and rotatably driving it, are provided in the process tank 1 at a portion facing the inlet/outlet port 2.

The holding/driving means 8 has a pair of hollow movable members 11 each forming a Y shape when seen from the top. One side surface of each distal end portion and the proximal end portion, of each of a pair of branch portions of the movable members 11, respectively have holding rollers 12.

Figure 7:
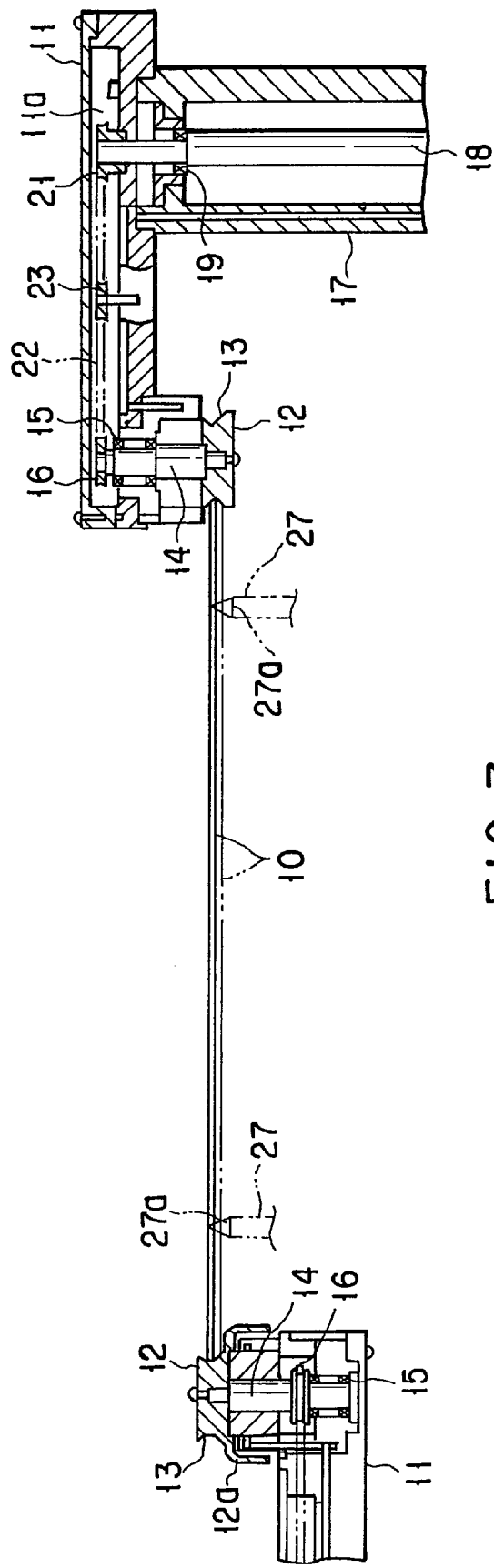
FIG. 7 is a side sectional view of the holding/driving means according to this embodiment of the present invention.

As shown in FIG. 7, each holding roller 12 has a V-shaped holding groove 13 in its outer surface, and one end portion of a support shaft 14 is fitted in the central portion of each holding roller 12. The support shafts 14 are rotatably supported by bearings 15 provided in the movable members 11. Driven pulleys 16 are fitted in those portions of the movable members 11 which correspond to the support shafts 14.

Figure 6:
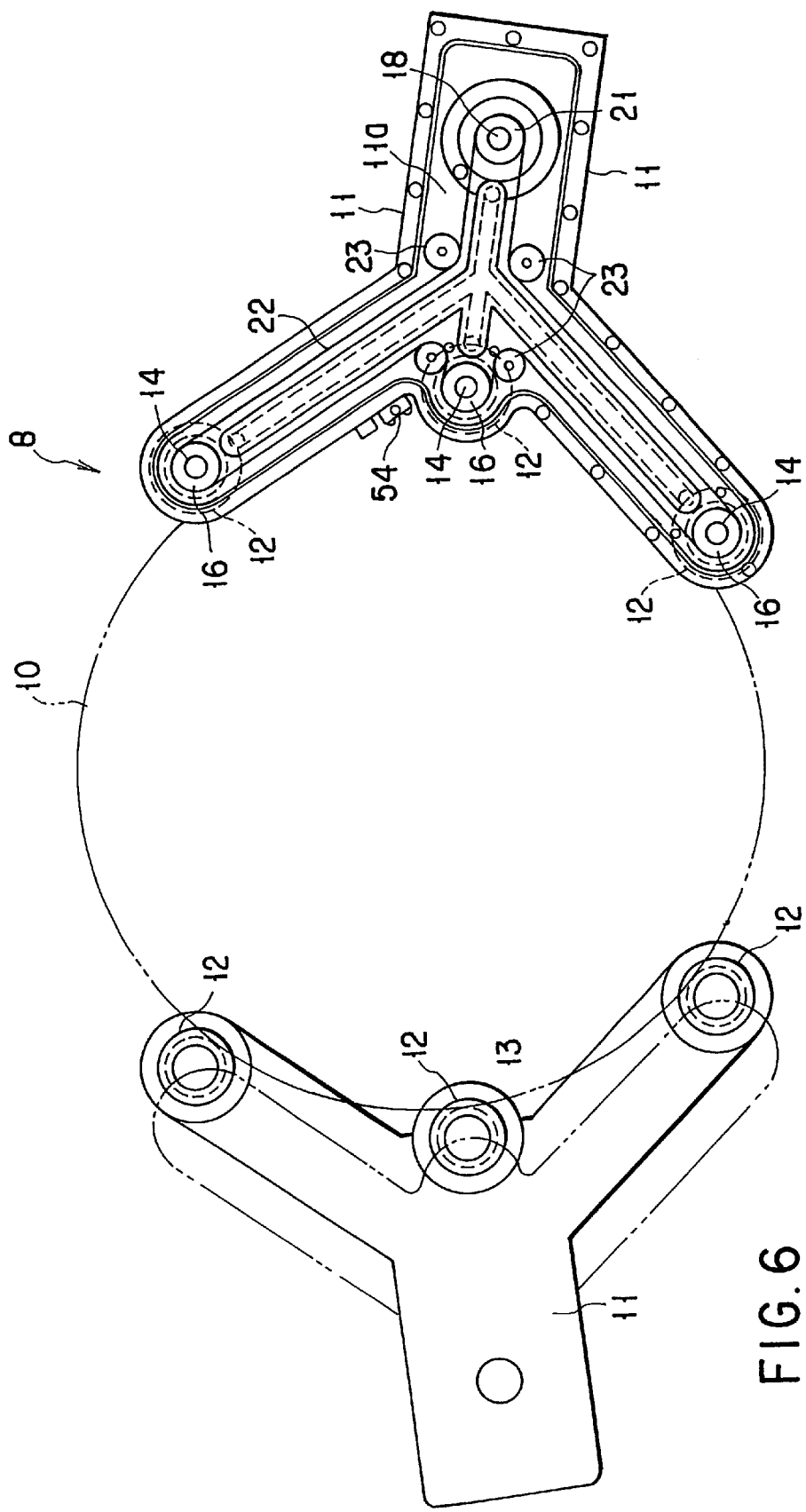
FIG. 6 is a plan view of the holding/driving means according to this embodiment of the present invention.

As shown in FIGS. 6 and 7, the movable members 11 are arranged such that one side surface of one movable member 11, where the holding roller 12 is provided, faces up while one corresponding side surface of the other movable member 11 faces down. Accordingly, in one movable member 11 with the holding rollers 12 facing up, the driven pulleys 16 are provided midway along the axial direction of the support shafts 14 while in the other movable member 11, the driven pulleys 16 are provided to the upper end portions in the axial direction of the support shafts 14.

As shown in FIG. 7, the upper end of a cylinder 17 is connected to the proximal end portion of the movable member 11. A rotating shaft 18 rotatably supported by a bearing 19 at its upper end portion and rotatably driven by a driving source (not shown) extends through the cylinder 17. The upper end portion of the rotating shaft 18 projects into an internal space 11a in the movable member 11, and a driving pulley 21 is fitted on this projecting end portion.

A belt 22 is looped between the driving pulley 21 and the three driven pulleys 16. As shown in FIG. 6, a plurality of tension rollers 23 are provided in the movable members 11 to apply a predetermined tension to the belt 22 to cause it to come into contact with the driving pulley 21 and driven pulleys 16.

Hence, when the driving pulley 21 is rotatably driven by the rotating shaft 18, the three driven pulleys 16 rotate in the same direction through the belt 22.

The pair of movable members 11 can move in directions to come close to and separate from each other as indicated by arrows X in FIG. 1, and are driven by a driving source (not shown).

Figure 5:
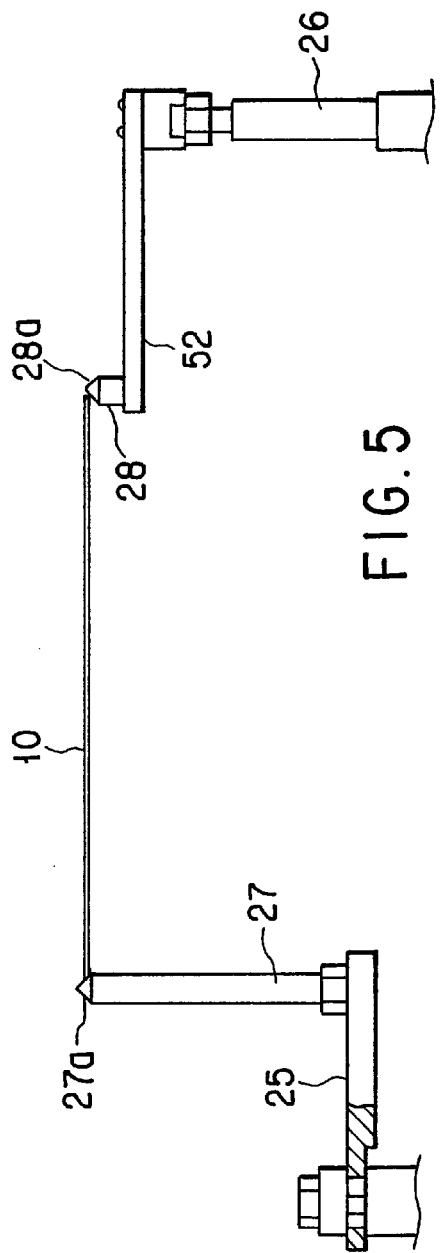
FIG. 5 is a view for explaining a support means according to this embodiment of the present invention.

The support mechanism 7 is constituted by a pair of first supports 25 provided to the inlet/outlet port 2 side of the process tank 1, and a pair of second supports 26 provided in the process tank 1 deeper than the first supports 25. The supports 25 and 26 respectively have support shafts 27 and 28 with distal ends that form taper surfaces 27a and 28a. When the robot hand 6 which holds the semiconductor wafer 10 enters the process tank 1 and then moves down, the edge portion of the semiconductor wafer 10 engages with the taper surfaces 27a and 28a of the support shafts 27 and 28, and is held by them as shown in FIG. 5.

While the support shafts 27 and 28 of the supports 25 and 26 support the semiconductor wafer 10, when the pair of movable members 11 are driven in directions to come close to each other, the edge portion of the semiconductor wafer 10 engages with the holding grooves 13 of the holding rollers 12 provided in the movable members 11, and the semiconductor wafer 10 is held as it moves upward from the taper surfaces 27a and 28a of the support shafts 27 and 28.

While the semiconductor wafer 10 is held by the holding rollers 12, when the holding rollers 12 are rotatably driven, the semiconductor wafer 10 can be rotated in the circumferential direction.

Upper and lower tool units 31 and 32 are disposed in the process tank 1 deeper than the support mechanism 7. The respective tool units 31 and 32 have cylindrical support cylinders 33 and 34 standing upright in the process tank 1. Proximal end portions of upper and lower arms 35 and 36 are rotatably attached to the upper ends of the support cylinders 33 and 34, respectively. The arms 35 and 36 are driven by driving sources (not shown) provided in the support cylinders 33 and 34 to swing in the horizontal direction within a predetermined range.

A disk-like upper cleaning brush 37 is attached on the lower surface of the distal end portion of the upper arm 35, and a lower cleaning brush 38 is attached on the upper surface of the lower arm 36. The respective cleaning brushes 37 and 38 are respectively, rotatably driven by driving sources (not shown) incorporated in the arms 35 and 36.

When the upper and lower arms 35 and 36 are swingably driven, the upper and lower cleaning brushes 37 and 38 move along traces indicated by arrows in FIG. 1. Therefore, the cleaning brushes 37 and 38 are swingably driven while spraying a processing solution to the upper and lower surfaces of the semiconductor wafer 10 with cleaning nozzles (to be described later), so that the upper and lower surfaces of the semiconductor wafer 10 are cleaned.

A tool cleaning unit 131 for cleaning the cleaning brushes 37 and 38 is provided on the extension of the swing direction at a position where the cleaning brushes 37 and 38 are set away from the semiconductor wafer 10.

The tool cleaning unit 131 has a tool cleaning member 132 which is held almost horizontally. The upper and lower surfaces of the tool cleaning member 132 have unevenness, and can spray a cleaning solution such as pure water. As the cleaning brushes 37 and 38 moves, they come into contact with the upper and lower and upper surfaces of the cleaning member 132.

Accordingly, after the tool cleaning brushes 37 and 38 are brought into contact with the tool cleaning member 132, the brushes 37 and 38 are rotated and the cleaning solution is sprayed from the upper and lower surfaces of the tool cleaning member 132, so that the cleaning brushes 37 and 38 that are soiled as they cleaned the semiconductor wafer 10 can be cleaned.

Upper and lower cleaning nozzles 44 and 45 are arranged at positions facing almost the central portions of the upper and lower surfaces of the semiconductor wafer 10 held by the holding rollers 12 of the holding/driving means 8. The nozzles 44 and 45 are provided on the distal ends of rods 46 such that their angles with respect to the axes of the rods 46 can be adjusted. The proximal end portions of the rods 46 are attached to a stand 47 vertically standing on the front end side of the inner bottom portion of the cleaning tank 1, such that the lengths of the rods 46 can be adjusted and that the rotating angles of the rods 46 in the circumferential direction can be adjusted.

A processing solution such as pure water or a chemical solution is supplied to the upper and lower cleaning nozzles 44 and 45. Hence, the processing solution can be supplied to the upper and lower surfaces of the semiconductor wafer 10 held by the holding/driving means 8, in the manner described above.

Figure 10:
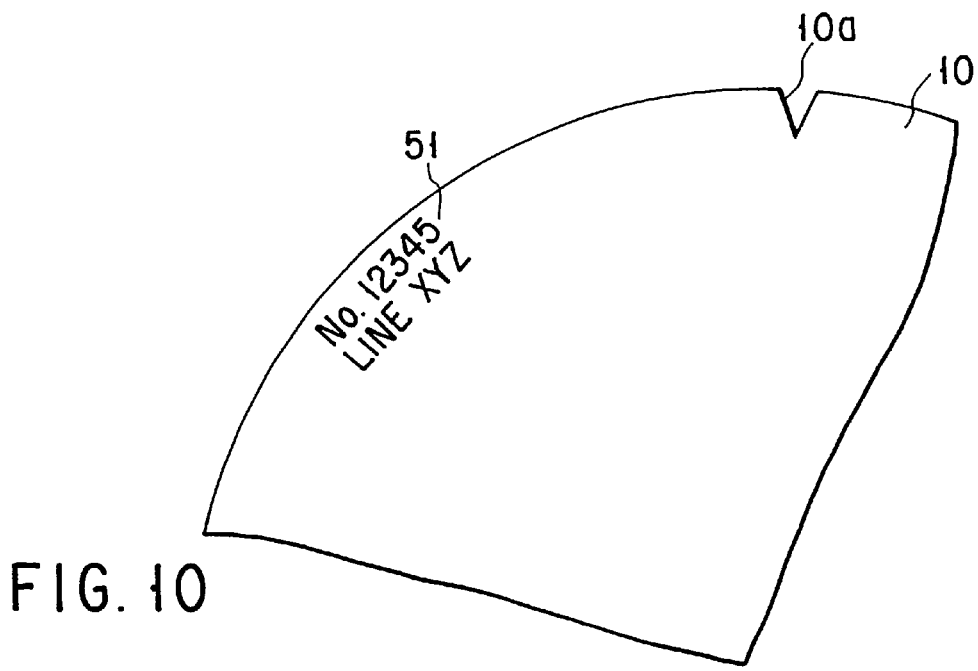
FIG. 10 is an enlarged plan view of a portion of the semiconductor wafer where a laser mark is formed according to this embodiment of the present invention.

As shown in FIG. 10, a laser mark 51 such as ID mark or lot No. is marked on the peripheral portion of the semiconductor wafer 10 at a predetermined circumferential position, usually at a position distant from a notch 10a formed in the semiconductor wafer 10 by a predetermined angle in the circumferential direction, in order to identify the semiconductor wafer 10.

The laser mark 51 is formed on either the upper surface (the surface where the circuit pattern is formed) or lower surface of the semiconductor wafer 10. When the laser mark 51 is marked by a laser beam, it forms a recess of about 20 $\mu$m to 50 $\mu$m. Therefore, in the process of forming a circuit pattern on the semiconductor wafer 10, if, e.g., CMP is performed, dust such as slurry sometimes enters the laser mark 51.

Figure 8:
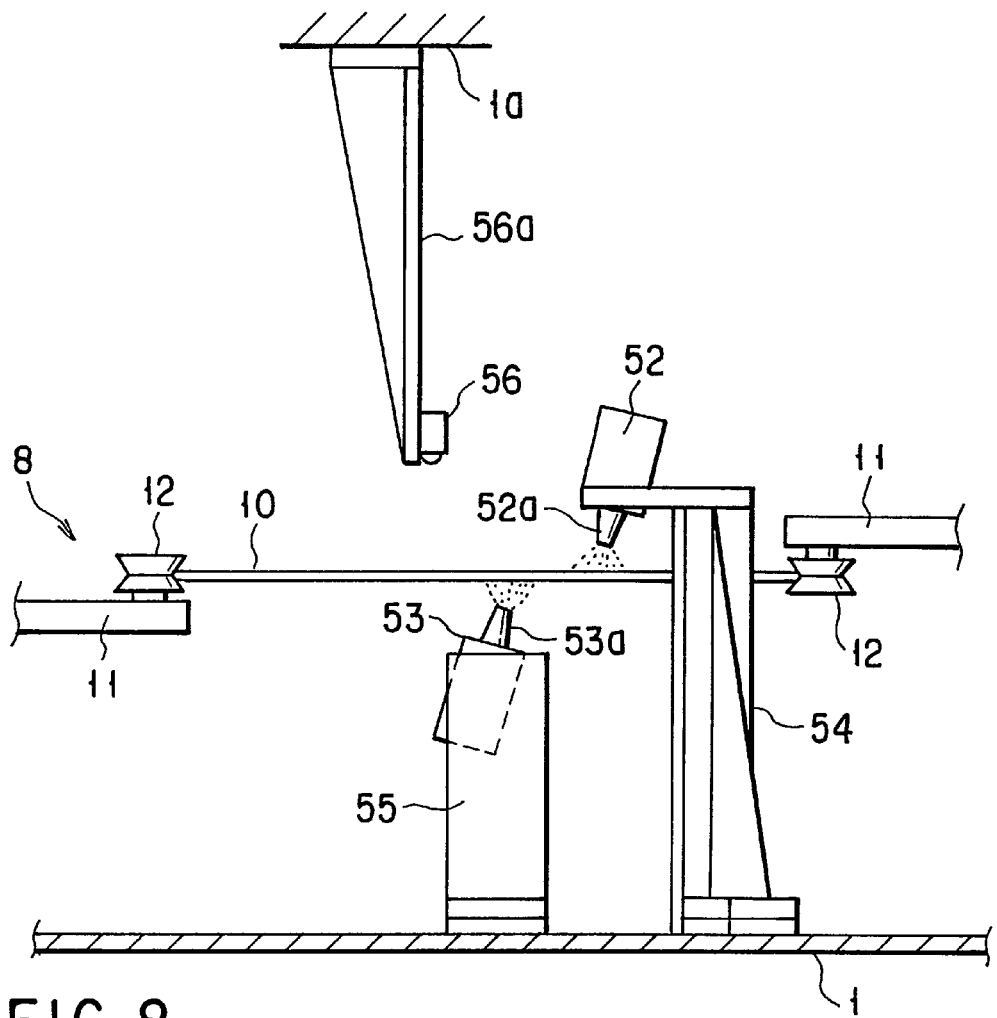
FIG. 8 is a side view showing how upper and lower ultrasonic nozzles are arranged according to this embodiment of the present invention.

Upper and lower ultrasonic nozzles 52 and 53 are arranged in the process tank 1 as shown in FIG. 1 to clean out and remove dust entering the laser mark 51. As shown in FIG. 8, the upper ultrasonic nozzle 52 is attached to an upper support column 54, and is positioned such that its nozzle port 52a faces the peripheral portion of the upper surface of the semiconductor wafer 10.

The lower ultrasonic nozzle 53 is attached to a lower support column 55, and is positioned such that its nozzle port 53a faces the peripheral portion of the lower surface of the semiconductor wafer 10.

As shown in FIG. 8, an image sensing camera 56 is disposed above the holding/driving means 8 to sense the semiconductor wafer 10 held by the holding/driving means 8. The image sensing camera 56 is attached to a bracket 56a vertically hanging from a ceiling 1a of the process tank 1. An image sensing signal from the image sensing camera 56 is input to an image processing unit 57 shown in FIG. 9 and is processed by it. The rotational angle of the semiconductor wafer 10 in this image sensing is detected from the position of the notch 10a formed in the semiconductor wafer 10 in this embodiment.

A processed signal from the image processing unit 57 is input to a controller 58. The controller 58 controls rotation of the semiconductor wafer 10 on the basis of the processed signal sent from the image processing unit 57.

In other words, when the rotational angle of the semiconductor wafer 10 is detected from the position of the notch 10a, the controller 58 calculates, on the basis of the detected angle and the rotational speed of the semiconductor wafer 10, a time required until the laser mark 51 reaches the cleaning region of the upper or lower ultrasonic nozzle 52 or 53.

When the laser mark 51 reaches the cleaning region of the upper or lower ultrasonic nozzle 52 or 53, the controller 58 controls rotation of the semiconductor wafer 10, i.e., the holding/driving means 8, so that dust deposited in the recess of the laser mark 51 is removed reliably.

Various methods to be described below are available to control rotation of the semiconductor wafer 10. According to the first method, when the entire laser mark 51 enters the cleaning region of the upper or lower ultrasonic nozzle 52 or 53, rotation of the semiconductor wafer 10 is stopped for a predetermined period of time. Then, the laser mark 51 can be cleaned by the processing solution which is sprayed from the upper or lower ultrasonic nozzle 52 or 53 and to which ultrasonic vibration is applied, until dust deposited in it is removed. In this case, the time during which rotation of the semiconductor wafer 10 is stopped may be set experimentally.

According to the second method of controlling rotation of the semiconductor wafer 10, the semiconductor wafer 10 is reciprocally moved clockwise and counterclockwise a predetermined number of times within such a range that the laser mark 51 does not fall outside the cleaning range of the upper or lower ultrasonic nozzle 52 or 53. Hence, the laser mark 51 is repeatedly cleaned with the processing solution in spray directions relatively different from each other. As a result, the cleaning effect can be enhanced more than in a case wherein the semiconductor wafer 10 is cleaned while its rotation is kept stopped.

According to the third method, when the laser mark 51 reaches the cleaning region of the upper or lower ultrasonic nozzle 52 or 53, the rotational speed of the semiconductor wafer 10 is sufficiently decreased until the laser mark 51 falls outside the cleaning region. The reduction ratio is determined by the cleaning effect and a tact time required for cleaning.

With the first and second methods, although the cleaning effect of the laser mark 51 can be enhanced, during cleaning, only those portions of the upper and lower surfaces of the semiconductor wafer 10 which are along the traces of the upper and lower cleaning brushes 37 and 38 can be cleaned by these brushes. Accordingly, the tact time required for cleaning increases. Namely, when cleaning is performed with the upper and lower cleaning brushes 37 and 38, the semiconductor wafer 10 must be rotated. During cleaning of the laser mark 51, cleaning of the upper and lower surfaces of the semiconductor wafer 10 does not progress, so the tact time increases.

According to the third method, rotation of the semiconductor wafer 10 in a predetermined direction need not be stopped even while the laser mark 51 is being cleaned.

Cleaning of the upper and lower surfaces of the semiconductor wafer 10 can be progressed simultaneously with cleaning of the laser mark 51. Therefore, the tact time required for cleaning the semiconductor wafer 10 can be decreased to be shorter than that obtained with the first or second method.

When compared to a case wherein cleaning of the laser mark 51 is performed in a step separate from the step of cleaning the upper and lower surfaces of the semiconductor wafer 10, the processing efficiency can be improved with the first or second method described above. According to the third method, the processing efficiency can be further improved.

Since the laser mark 51 is formed on only either the upper or lower surface of the semiconductor wafer 10, the cleaning solution may be sprayed from only one of the upper and lower ultrasonic nozzles 52 and 53 which corresponds to the surface formed with the laser mark 51. If the laser mark 51 to be formed on the semiconductor wafer 10, which is to be processed by the process tank 1, is determined to be formed on either the upper or lower surface, only either the upper or lower ultrasonic nozzle 52 or 53 need be provided accordingly.

Figures 9, 11:
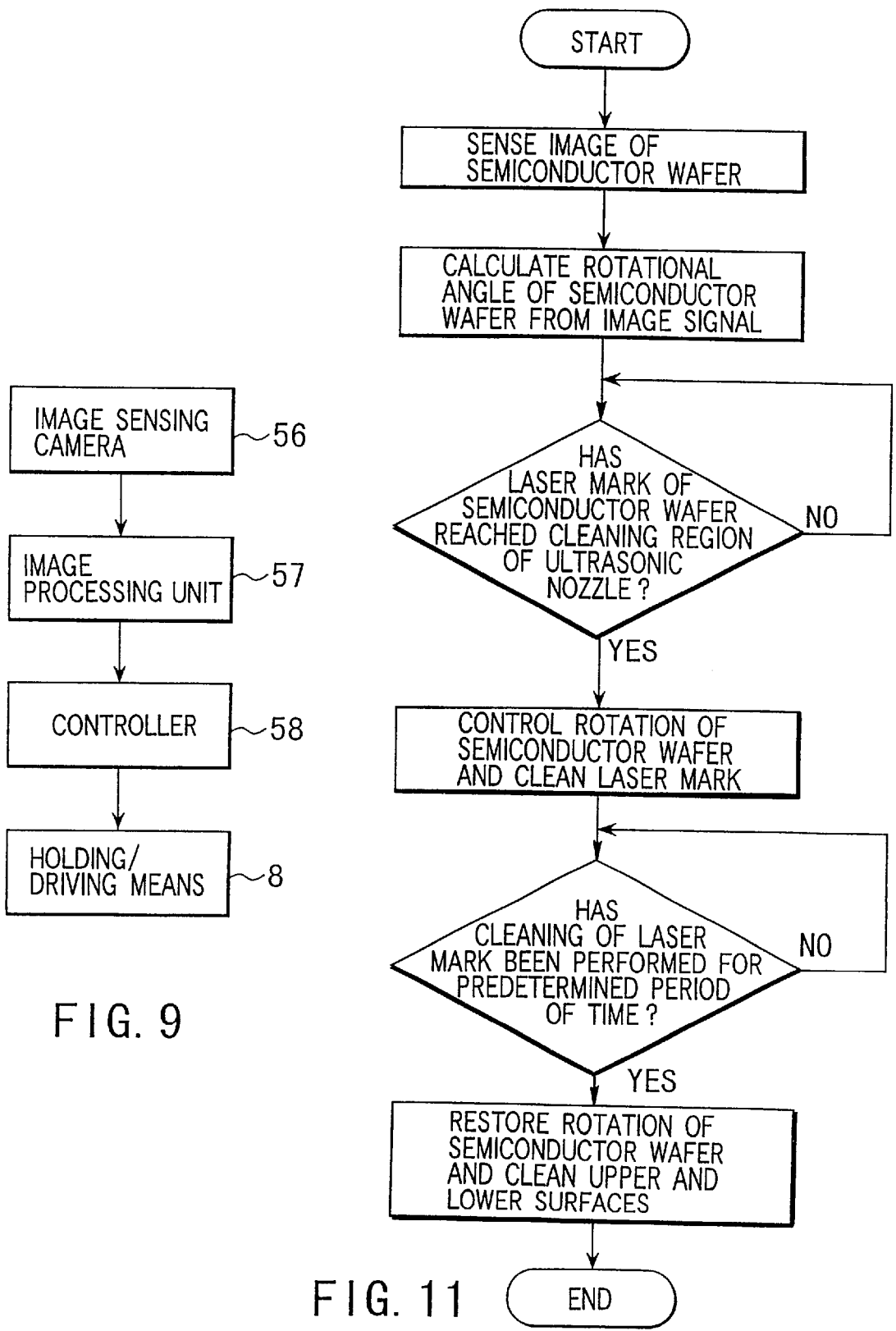
FIG. 9 is a block diagram of a control circuit for controlling rotation of a semiconductor wafer according to this embodiment of the present invention.
FIG. 11 is a flow chart showing how the laser mark is cleaned according to this embodiment of the present invention.

FIG. 11 shows an example of a flow chart showing how the laser mark 51 of the semiconductor wafer 10 is cleaned.

In this manner, the exclusive ultrasonic nozzles 52 and 53 for cleaning the laser mark 51 formed on the semiconductor wafer 10 are provided in the process tank 1, and the laser mark 51 is cleaned by controlling rotation of the semiconductor wafer 10.

Therefore, the cleaning step can be prevented from being ended before dust deposited in the laser mark 51 is removed. More specifically, cleaning of the laser mark 51 which is not conventionally performed is performed, so that occurrence of a rejected product due to dust deposited on the laser mark 51 can be prevented. In addition, since the laser mark 51 is cleaned by controlling rotation of the semiconductor wafer 10, the laser mark 51 can be cleaned reliably.

Since the semiconductor wafer 10 is held by the holding/driving means 8 and then the laser mark 51 on the semiconductor wafer 10 is cleaned, cleaning of the laser mark 51 can be performed simultaneously with cleaning of the surface of the semiconductor wafer 10. As a result, the tact time required for cleaning the semiconductor wafer 10 can be prevented from being largely prolonged by cleaning the laser mark 51.

Figure 12:
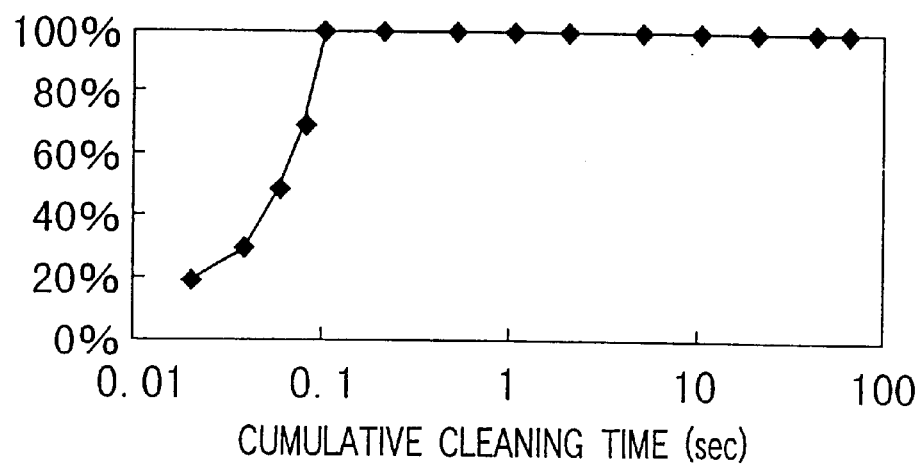
FIG. 12 is a graph showing the relationship between a cumulative cleaning time and a foreign substance removing ratio obtained when the semiconductor wafer is cleaned while being rotated according to this embodiment of the present invention.

The cleaning effect of the laser mark 51 largely depends on the cumulative cleaning time of the ultrasonic vibration-applied cleaning solution. Hence, the laser mark 51 was cleaned with an ultrasonic vibration-applied cleaning solution, and the relationship between the obtained cumulative cleaning time and foreign substance (dust) removing ratio was measured. The foreign substance removing ratio was observed and measured with an SEM (Scanning Electron Microscope). FIG. 12 shows the measurement result.

The cleaning conditions are as follows. The semiconductor wafer 10 was a mirror-polished, non-cleaned one. As the processing solution, ozone water having a concentration of 20 ppm was used. The flow rate was 1 L (litter)/min to 1.2 L/min. The rotational speed of the semiconductor wafer was 300 rpm. The oscillation frequency of the ultrasonic cleaning nozzles was 1.6 MHz.

The semiconductor wafer was continuously rotated. The cumulative cleaning time was calculated from a time through which the laser mark passes the cleaning regions of the ultrasonic cleaning nozzles. In this embodiment, the range of the surface of the semiconductor wafer which can be effectively cleaned with the cleaning solution from the ultrasonic nozzles is with a diameter of 20 mm. This range corresponds to about 2% of the circumference when the diameter of the semiconductor wafer is 300 mm. In this embodiment, when the semiconductor wafer is rotated at 300 rpm to clean its upper and lower surfaces for 60 sec, the cumulative cleaning time of the laser mark is 1.2 sec.

When the laser mark was cleaned with the above conditions, as is seen from FIG. 12, it was confirmed that the foreign substance removing ratio was 20% with a cumulative cleaning time of 0.02 sec, 30% with 0.04 sec, 50% with 0.06 sec, 70% with 0.08 sec, and 100% with 0.1 sec or more.

Therefore, if the cumulative cleaning time is set to 0.1 sec or more so that the removing ratio becomes 100% or more, dust deposited in the laser mark can be reliably cleaned out and removed.

Figure 13:
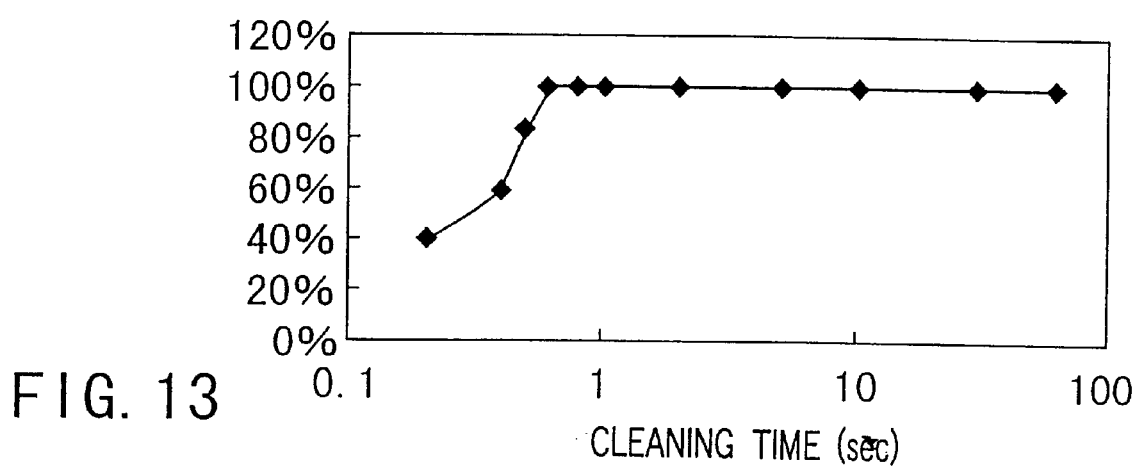
FIG. 13 is a graph showing the relationship between a cleaning time and a foreign substance removing ratio obtained when the semiconductor wafer is cleaned without being rotated according to this embodiment of the present invention.

FIG. 13 shows a result obtained by measuring the cleaning time and the foreign substance removing ratio when the laser mark is cleaned while rotation of the semiconductor wafer is stopped. In this case, the cleaning conditions are as follows. The semiconductor wafer was a mirror-polished, non-cleaned one. As the processing solution, ozone water having a concentration of 20 ppm was used. The flow rate was 1 L/min to 1.2 L/min. The laser mark was formed on the semiconductor wafer to have a width of 2 mm and a length of about 20 mm in the circumferential direction. The ultrasonic cleaning nozzles were fixed at such positions that the processing solution from the ultrasonic cleaning nozzles is sprayed onto the laser mark.

As is apparent from the result shown in FIG. 13, it was confirmed that the foreign substance removing ratio was 40% with a cleaning time of 0.2 sec, 60% with 0.4 sec, and 100% with 0.6 sec or more. In other words, when the semiconductor wafer is cleaning by stopping its rotation, 100% of the foreign substance can be removed with the cleaning time of 0.6 sec or more. Accordingly, when rotation of the semiconductor wafer is stopped, the cleaning time may be set to 0.6 sec or more.

In this case, since rotation of the semiconductor wafer is stopped, the cleaning time for the laser mark can be controlled highly precisely. In this experiment, it was possible to control the cleaning time in units of 0.01 sec.

Figure 14:
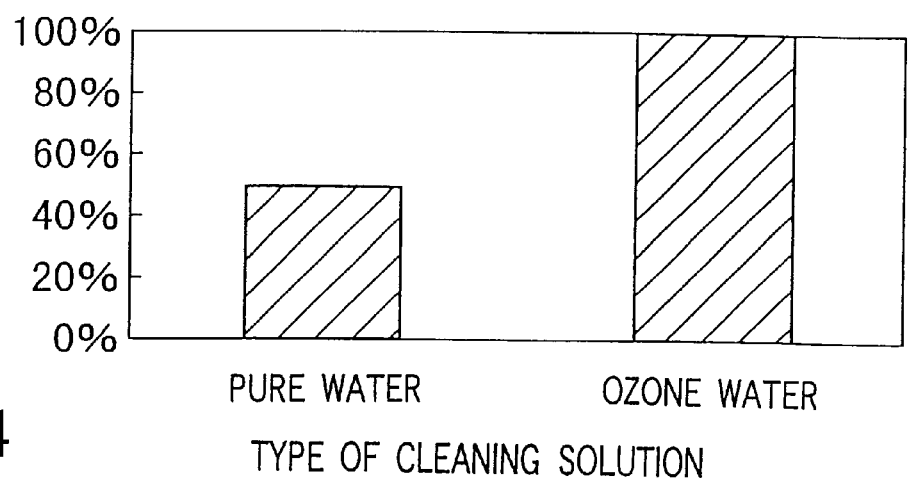
FIG. 14 is a graph showing the relationship between the type of processing solution and the foreign substance removing ratio according to this embodiment of the present invention.

FIG. 14 shows a result obtained by measuring a foreign substance removing ratio when a mirror-polished, non-cleaned semiconductor wafer was employed as an evaluation sample and pure water or ozone water is employed as the processing solution.

Regarding the cleaning conditions, the concentration of the ozone water is 20 ppm, the flow rate is 1 L/min to 1.2 L/min for both the pure water and ozone water, the rotational speed of the semiconductor wafer is 300 rpm, the oscillation frequency of the employed ultrasonic oscillation nozzles is 1.6 MHz, and the cumulative cleaning time of the laser mark is 0.4 sec.

When cleaning was performed with the above conditions, the foreign substance removing ratio was 50% when the processing solution was pure water, and was 100% when the processing solution was ozone water. Therefore, it was confirmed that when ozone water was used, the laser mark was cleaned more reliably than a case wherein pure water was used.

In the embodiment described above, when detecting the position of the laser mark formed on the semiconductor wafer, the image of the semiconductor wafer is sensed, and the position of the laser mark is calculated from the position of the notch formed in the semiconductor wafer. If the laser mark can be reliably recognized by the image sensing camera, the position of the laser mark may be directly calculated from the image sensing signal of the laser mark.

In place of the image sensing camera, a contact or non-contact switch may be formed on the outer peripheral surface of the semiconductor wafer which is driven rotatably, and the position of the laser mark may be calculated by detecting the notch with this switch. It suffices if a means that can detect the rotational position of the laser mark is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method of cleaning a laser mark formed on a surface of a substrate, comprising the steps of
   holding the substrate and rotating the substrate in a circumferential direction,
   detecting a laser mark formed on the substrate in a non-contact manner, and
   controlling rotation of the substrate on the basis of detection of the laser mark and spraying an ultrasonic vibration-applied processing solution to the laser mark formed on the substrate.

2. A substrate processing method according to claim 1, wherein the step of spraying the ultrasonic vibration-applied processing solution to the laser mark on the substrate comprises simultaneously performing the step of cleaning the surface of the semiconductor wafer.

3. A substrate processing method according to claim 1, wherein controlling rotation of the substrate on the basis of detection of the laser mark comprises stopping rotation of the substrate at a predetermined position.

4. A substrate processing method according to claim 1, wherein controlling rotation of the substrate on the basis of detection of the laser mark comprises reciprocally rotating the substrate clockwise and counterclockwise within a predetermined range.

5. A substrate processing method according to claim 1, wherein controlling rotation of the substrate on the basis of detection of the laser mark comprises decreasing a rotational speed of the substrate within a predetermined range.

6. A substrate processing method according to claim 1, wherein the processing solution sprayed to the substrate is ozone water.

7. A substrate processing method according to claim 1, wherein spraying the processing solution to the laser mark on the substrate is performed for the laser mark, while rotating the substrate, for a cumulative time of not less than 0.1 sec.

8. A substrate processing method according to claim 4, wherein spraying the processing solution to the laser mark on the substrate is performed for the laser mark, while rotating the substrate, for a cumulative time of not less than 0.1 sec.

9. A substrate processing method according to claim 5, wherein spraying the processing solution to the laser mark on the substrate is performed for the laser mark, while rotating the substrate, for a cumulative time of not less than 0.1 sec.

10. A substrate processing method according to claim 1, wherein spraying the processing solution to the laser mark on the substrate is performed for the laser mark, while the substrate is kept stopped, for not less than 0.6 sec.

11. A substrate processing method according to claim 1, wherein cleaning of the laser mark is performed simultaneously with cleaning of the surface of the substrate.

12. A substrate processing apparatus for cleaning a laser mark formed on a surface of a substrate, comprising
    holding/driving means for holding the substrate and rotating the substrate in a circumferential direction,
    detection means for detecting a laser mark formed on the substrate in a non-contact manner,
    an ultrasonic nozzle arranged to face the surface of the substrate to spray an ultrasonic vibration-applied processing solution toward the substrate, and
    control means for controlling rotation of the substrate held by the holding means on the basis of detection of the laser mark by the detection means, and cleaning the laser mark on the substrate with the processing solution sprayed from the ultrasonic nozzle.

13. A substrate processing apparatus according to claim 12, further comprising cleaning means for cleaning the surface of the substrate, held by the holding/driving means, simultaneously with cleaning the laser mark on the substrate.

* * * * *